(12) United States Patent
Kim et al.

(10) Patent No.: US 11,205,604 B2
(45) Date of Patent: Dec. 21, 2021

(54) SEMICONDUCTOR PACKAGE INCLUDING A THERMAL CONDUCTIVE LAYER AND METHOD OF MANUFACTURING THE SAME

(71) Applicant: Samsung Electronics Co., Ltd., Suwon-si (KR)

(72) Inventors: Jae Choon Kim, Incheon (KR); Woo Hyun Park, Seongnam-si (KR); Eon Soo Jang, Hwaseong-si (KR); Young Sang Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 16/148,471

(22) Filed: Oct. 1, 2018

(65) Prior Publication Data

US 2019/0237382 A1 Aug. 1, 2019

(30) Foreign Application Priority Data

Jan. 29, 2018 (KR) .................. 10-2018-0010699

(51) Int. Cl.
*H01L 23/36* (2006.01)
*H01L 23/367* (2006.01)
(Continued)

(52) U.S. Cl.
CPC ........ *H01L 23/367* (2013.01); *H01L 21/4857* (2013.01); *H01L 21/6835* (2013.01); *H01L 23/13* (2013.01); *H01L 23/3128* (2013.01); *H01L 23/36* (2013.01); *H01L 23/3677* (2013.01); *H01L 23/5383* (2013.01); *H01L 23/5386* (2013.01); *H01L 23/5389* (2013.01);
(Continued)

(58) Field of Classification Search
CPC .............. H01L 23/3672; H01L 23/367; H01L 21/4857; H01L 2224/023; H01L 23/373; H01L 2023/4043; H01L 2924/15153; H01L 23/3677; H01L 24/19; H01L 23/3128; H01L 23/5383–5386; H01L 24/20; H01L 21/6835; H01L 23/5389; H01L 2224/211; H01L 2224/221; H01L 2221/68345; H01L 2221/68359; H01L 25/105

See application file for complete search history.

(56) References Cited

U.S. PATENT DOCUMENTS 8,975,732 B2 3/2015 Tojo et al.
9,318,411 B2 4/2016 Lin et al.
(Continued)

*Primary Examiner* — Latanya N Crawford Eason
(74) *Attorney, Agent, or Firm* — Muir Patent Law, PLLC

(57) ABSTRACT

A semiconductor package includes a semiconductor chip having a first surface that is an active surface and a second surface opposing the first surface, a first redistribution portion disposed on the first surface, the first redistribution portion including a lower wiring layer electrically connected to the semiconductor chip, a thermal conductive layer disposed on the second surface of the semiconductor chip, a sealing layer surrounding a side surface of the semiconductor chip and a side surface of the thermal conductive layer, and a second redistribution portion disposed on the sealing layer, the second redistribution portion including a first upper wiring layer connected to the thermal conductive layer, the second redistribution portion including a second upper wiring layer electrically connected to the semiconductor chip.

16 Claims, 11 Drawing Sheets

(51) Int. Cl.

| | |
|---|---|
| *H01L 23/31* | (2006.01) |
| *H01L 23/538* | (2006.01) |
| *H01L 23/00* | (2006.01) |
| *H01L 21/48* | (2006.01) |
| *H01L 21/683* | (2006.01) |
| *H01L 23/13* | (2006.01) |
| *H01L 25/10* | (2006.01) |
| *H01L 23/498* | (2006.01) |

(52) U.S. Cl.
CPC ............ *H01L 24/19* (2013.01); *H01L 24/20* (2013.01); *H01L 23/49816* (2013.01); *H01L 25/105* (2013.01); *H01L 2221/68345* (2013.01); *H01L 2221/68359* (2013.01); *H01L 2224/211* (2013.01); *H01L 2224/221* (2013.01); *H01L 2225/1035* (2013.01); *H01L 2225/1058* (2013.01); *H01L 2225/1094* (2013.01)

(56) References Cited

U.S. PATENT DOCUMENTS

| | | | |
|---|---|---|---|
| 9,583,472 | B2 | 2/2017 | Chung et al. |
| 9,735,987 | B2 | 8/2017 | Farkas et al. |
| 2011/0291249 | A1* | 12/2011 | Chi .................. H01L 21/56 257/675 |
| 2016/0021753 | A1* | 1/2016 | Tomikawa ........... H05K 3/4697 361/761 |
| 2016/0118333 | A1* | 4/2016 | Lin ..................... H01L 25/16 257/773 |
| 2017/0018505 | A1* | 1/2017 | Lin ..................... H01L 23/5389 |
| 2017/0162556 | A1* | 6/2017 | Lin ..................... H01L 23/4334 |
| 2017/0207205 | A1 | 7/2017 | Kim et al. |
| 2017/0213793 | A1* | 7/2017 | Hurwitz ................. H01L 23/36 |
| 2017/0294422 | A1* | 10/2017 | Solimando ........... H01L 25/105 |
| 2018/0197831 | A1* | 7/2018 | Kim ..................... H01L 24/97 |
| 2019/0096791 | A1* | 3/2019 | Jeng ..................... H01L 23/3114 |
| 2019/0139853 | A1* | 5/2019 | Oh ........................ H01L 24/20 |

\* cited by examiner

SEMICONDUCTOR PACKAGE INCLUDING A THERMAL CONDUCTIVE LAYER AND METHOD OF MANUFACTURING THE SAME

CROSS-REFERENCE TO RELATED APPLICATION

This application claims priority under 35 U.S.C. § 119 to Korean Patent Application No. 10-2018-0010699 filed on Jan. 29, 2018 in the Korean Intellectual Property Office, the disclosure of which is incorporated herein by reference in its entirety.

BACKGROUND

1. Field

The present inventive concept relates to a semiconductor package and a method of manufacturing the semiconductor package.

2. Description of Related Art

With the development of the electronics industry, there is a growing demand for high-performance, high-speed and miniaturization of electronic components. According to this tendency, there is also a growing need for miniaturization and multifunctionalization of semiconductor chips used in electronic components. Accordingly, a semiconductor chip having a fine-pitch connection terminal is beneficial, and a fan-out semiconductor package having various structures for redistributing to the outside of a semiconductor chip is being developed.

SUMMARY

An aspect of the present inventive concept provides a semiconductor package with improved reliability.

According to an aspect of the present inventive concept, a semiconductor package includes a semiconductor chip having a first surface that is an active surface, and a second surface opposing the first surface, a first redistribution portion disposed on the first surface, the first redistribution portion including a lower wiring layer electrically connected to the semiconductor chip, a thermal conductive layer disposed on the second surface of the semiconductor chip, a sealing layer surrounding a side surface of the semiconductor chip and a side surface of the thermal conductive layer, and a second redistribution portion disposed on the sealing layer, the second redistribution portion including a first upper wiring layer connected to the thermal conductive layer, the second redistribution portion including a second upper wiring layer electrically connected to the semiconductor chip.

According to an aspect of the present inventive concept, a semiconductor package includes a core layer having a through-hole, a semiconductor chip having a first surface that is an active surface, and a second surface opposing the first surface, the semiconductor chip mounted in the through-hole of the core layer, a first redistribution portion disposed on the first surface, the first redistribution portion including a lower wiring layer electrically connected to the semiconductor chip, a thermal conductive layer disposed on the second surface of the semiconductor chip, a sealing layer surrounding a side surface of the semiconductor chip and a side surface of the thermal conductive layer, and a second redistribution portion disposed on the sealing layer, the second redistribution portion including a first upper wiring layer connected to the thermal conductive layer, the second redistribution portion including a second upper wiring layer electrically connected to the first redistribution portion through the core layer.

According to an aspect of the present inventive concept, a semiconductor package includes a semiconductor chip, a first redistribution portion disposed on a lower surface of the semiconductor chip, the first redistribution portion including a lower wiring layer electrically connected to the semiconductor chip, a thermal conductive layer disposed on an upper surface of the semiconductor chip, having the same area as the semiconductor chip in a plan view, and a second redistribution portion disposed on the thermal conductive layer, the second redistribution portion including an upper wiring layer connected to the thermal conductive layer.

DETAILED DESCRIPTION

Hereinafter, preferred embodiments of the present inventive concept will be described with reference to the accompanying drawings.

Figure 1:
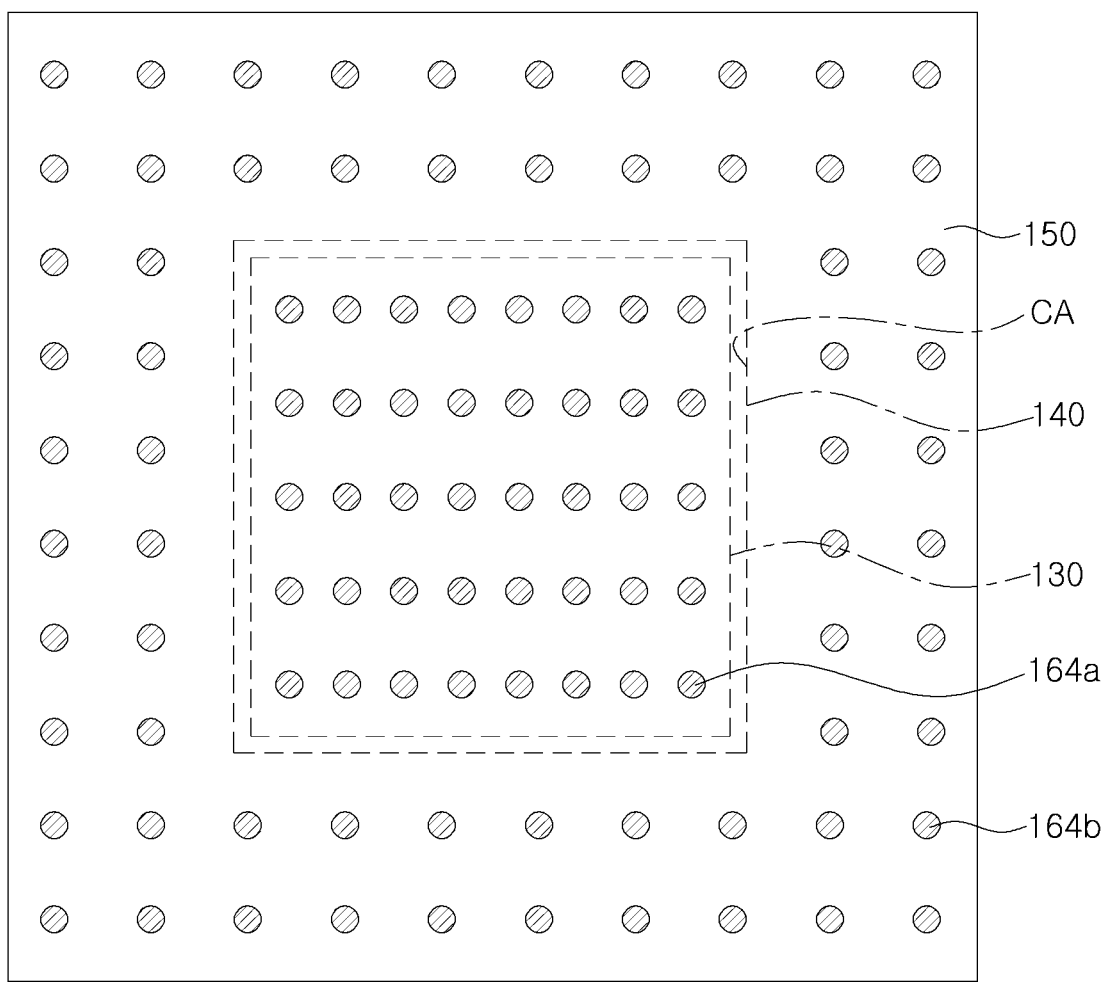
FIGS. 1 and 2 are respectively a schematic plan view and a cross-sectional view of a semiconductor package according to an example embodiment of the present inventive concept.
Figure 2:
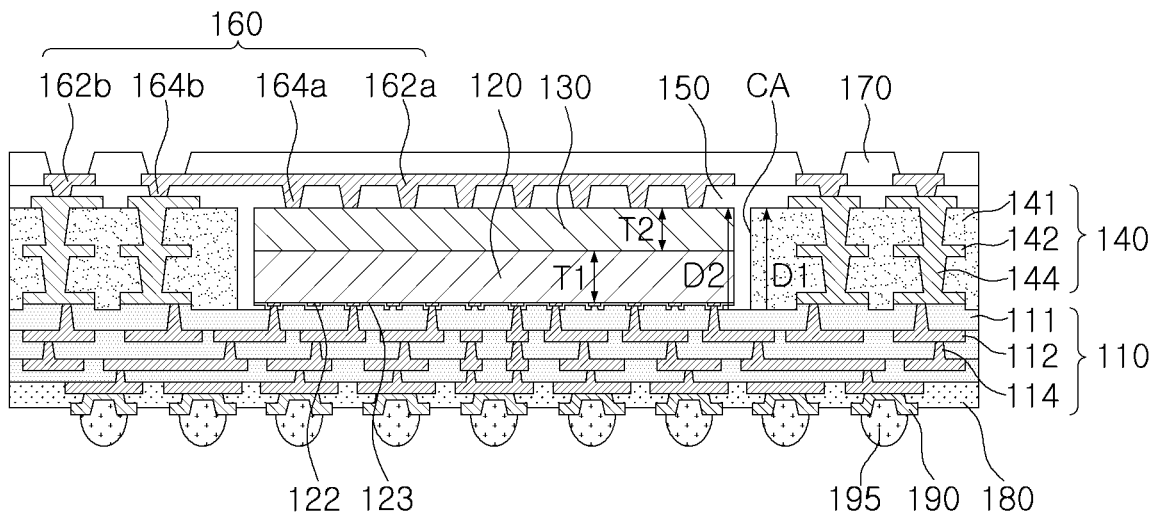

FIGS. 1 and 2 are respectively a schematic plan view and a cross-sectional view of a semiconductor package according to an example embodiment. Components disposed on upper portions of first and second upper vias 164a and 164b are omitted in FIG. 1.

Figure 3:
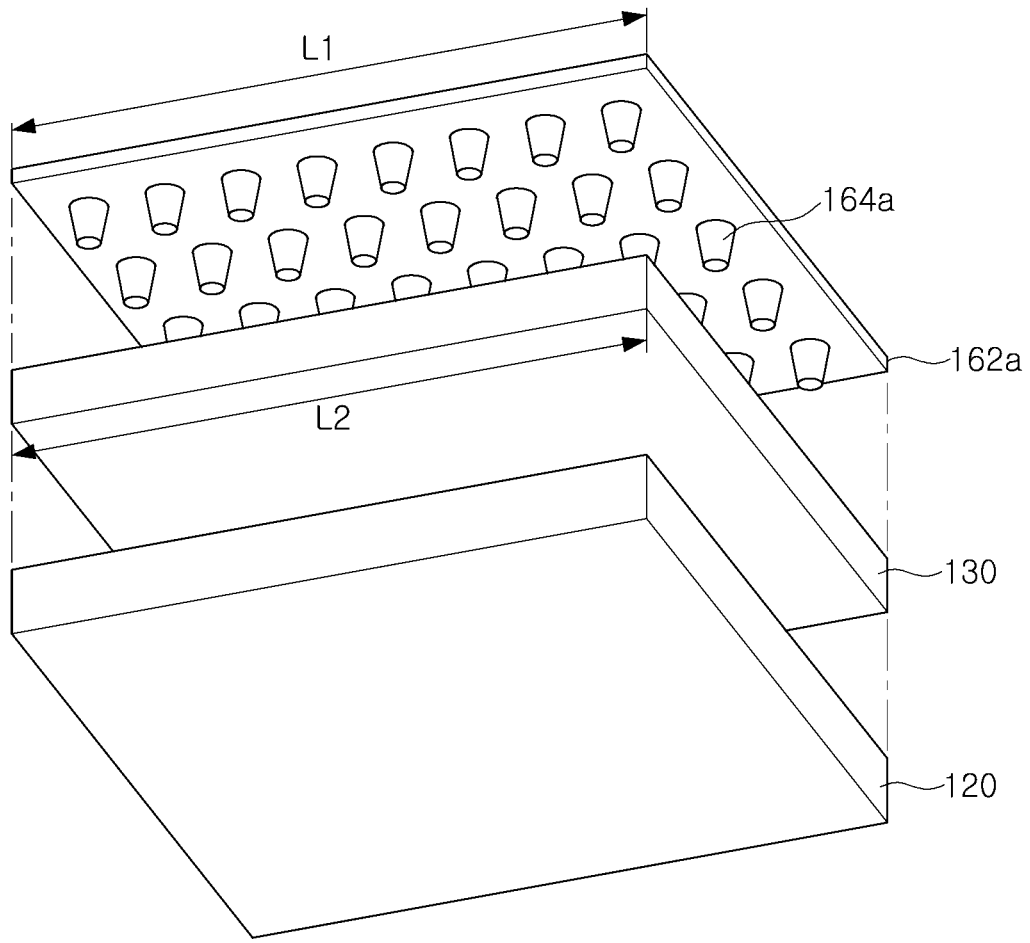
FIG. 3 is an exploded perspective view illustrating a portion of the semiconductor package of FIG. 2.

FIG. 3 is an exploded perspective view illustrating a portion of the semiconductor package of FIG. 2.

Referring to FIGS. 1 to 3, a semiconductor package 100 may include a semiconductor chip 120, a first redistribution portion 110, also described as a first redistribution layer, disposed on a lower portion of the semiconductor chip 120, a thermal conductive layer 130 disposed on an upper portion of the semiconductor chip 120, a sealing layer 150 surrounding a side surface of the semiconductor chip 120 and a side surface of the thermal conductive layer 130, and a second redistribution portion 160 disposed on the sealing layer 150 and connected to the thermal conductive layer 130. The semiconductor package 100 may further include a core layer 140 having a through-hole CA to allow the semiconductor chip 120 to be mounted therein, a first passivation layer 170 disposed on an upper portion of the second redistribution portion 160, a second passivation layer 180 disposed on a lower portion of the first redistribution portion 110, a pad metal layer 190, and connection terminals 195. The semiconductor package 100 may be a fan-out type semiconductor package in which connection pads 122 of the semiconductor chip 120 are redistributed externally.

The core layer 140 may include a through-hole CA penetrating upper and lower surfaces of the core layer 140 to mount the semiconductor chip 120 therein. The through-hole CA may be formed at the center of the core layer 140 as shown in FIG. 1, but the number and arrangement of the through-hole CA are not limited to those shown in the drawings. For example, two or more through-holes CA may be formed in a core layer 140 for mounting respective semiconductor chips 120, e.g., the same or different chips. In some embodiments, the through-hole CA may not completely penetrate the lower surface, and may have a cavity shape. For example, the core layer 140 may have a recess having a closed bottom and an open top, and the semiconductor chip 120 may be mounted in the recess.

The core layer 140 may include a core insulation layer 141, core wiring layers 142, and core vias 144. The core wiring layers 142 and the core vias 144 may be arranged to electrically connect the upper and lower surfaces (e.g., conductor patterns formed on the upper and lower surfaces) of the core layer 140. The core wiring layers 142 may be disposed inside the core insulation layer 141, but are not limited thereto. For example, some of the core wiring layers 142 may be formed on the upper and/or lower surfaces of the core layer 140. For example, some of the core wiring layers 142 may be exposed from the upper and/or lower surfaces of the core layer 140. The core wiring layers 142 exposed through the lower surface of the core layer 140 among the core wiring layers 142 may be embedded in the core insulation layer 141, and may be formed having such a structure according to a manufacturing process.

The core insulation layer 141 may include an insulating material, for example, a thermosetting resin such as an epoxy resin or a thermoplastic resin such as polyimide, and may further include an inorganic filler. Alternatively, the core insulation layer 141 may include a resin impregnated with a core material such as glass fiber, glass cloth, glass fabric, or the like, together with an inorganic filler, for example, prepreg, ABF (Ajinomoto Build-up Film), FR-4, BT (Bismaleimide Triazine), or the like.

The semiconductor chip 120 may be mounted in the through-hole CA of the core layer 140, and may be disposed apart from an inside wall of the through-hole CA. For example, the semiconductor chip 120 may be disposed apart from all inside walls of the through-hole CA of the core layer 140. The semiconductor chip 120 may include a logic semiconductor chip and/or a memory semiconductor chip. The logic semiconductor chip may be a microprocessor, for example, a central processing unit (CPU), a controller, an application specific integrated circuit (ASIC), or the like. The memory semiconductor chip may be a volatile memory such as a dynamic random access memory (DRAM), a static random access memory (SRAM), or the like, or a nonvolatile memory such as a flash memory, or the like. The semiconductor chip 120 may include connection pads 122 and a cover layer 123 disposed on the lower surface thereof. For example, the cover layer 123 may be an insulation layer covering portions of the respective connection pads 122 and the lower surface of the semiconductor chip 120. In the present example embodiment, a lower surface of the semiconductor chip 120 may be an active surface and the connection pads 122 may be disposed on the active surface. An upper surface opposing the lower surface of the semiconductor chip 120 may be an inactive surface while an arrangement position of the active surface may vary depending on example embodiments. The connection pads 122 may be disposed to electrically connect the semiconductor chip 120 to other components. For example, a redistribution layer, a bump, or the like may be disposed on the lower surface of the semiconductor chip 120 and may be connected to the connection pads 122. For example, the redistribution layer may be a layer forming the first redistribution portion 110, e.g., a lower wiring layer 112 or a layer forming the vias 114. The connection pads 122 may be made of a conductive material, for example, aluminum (Al). The cover layer 123 may be disposed to expose the connection pads 122 on the lower surface of the semiconductor chip 120. The cover layer 123 may include a silicon oxide film and/or a silicon nitride film. For example, the cover layer 123 may partially expose each of the connection pads 122.

The first redistribution portion 110 may redistribute the connection pads 122 from the lower portion of the semiconductor chip 120 to an outside area of the semiconductor chip 120. For example, the first redistribution portion 110 may electrically connect the connection pads 122 to conductor patterns formed opposite side of the redistribution portion 110 through the redistribution portion 110, thereby transferring electrical signals. The first redistribution portion 110 may include a plurality of lower insulation layers 111, a plurality of lower wiring layers 112, and a plurality of lower vias 114. The number and arrangement of the lower insulation layers 111, the lower wiring layers 112, and the lower vias 114, constituting the first redistribution portion 110, are not limited to those shown in the drawings, and may vary depending on example embodiments.

The lower insulation layers 111 may be made of an insulating material, for example, a photo imageable dielectric (PID) resin. In this case, the lower insulation layers 111 may further include an inorganic filler. Different lower insulation layers 111 may be made of the same materials as each other, or different materials from each other. The lower wiring layers 112 and the lower vias 114 may serve to redistribute the connection pads 122. For example, the arrangement of the connection pads 122 may be redistributed with the connection terminals 195 by electrically connecting the connection pads 122 and the connection terminals 195 with the lower wiring layers 112 and the lower vias 114. The lower vias 114 may have structures completely filling respective holes with a conductive material, but are not limited thereto, for example, the lower vias 114 may have a shape of the conductive material formed along the wall of respective holes, or may have various shapes such as a cylindrical shape, a tapered shape or the like. The lower wiring layers 112 and the lower vias 114 may include a conductive material such as copper (Cu), aluminum (Al), silver (Ag), tin (Sn), gold (Au), lead (Pb), titanium (Ti), or an alloy thereof.

The thermal conductive layer 130 may be disposed on the upper surface of the semiconductor chip 120. The thermal conductive layer 130 may be in contact with (i.e., touching) the upper surface of the semiconductor chip 120, or may be stacked via an adhesive layer or the like. The lower surface of the thermal conductive layer 130 may contact (i.e., touch) the semiconductor chip 120 or may be disposed closely to the semiconductor chip 120 with a thin adhesive layer between the semiconductor chip 120 and the thermal conductive layer 130, and the upper surface of the thermal conductive layer 130 may contact the first upper vias 164a and the sealing layer 150. The thermal conductive layer 130 may be disposed in the through-hole CA of the core layer 140. A second height D2 from the upper surface of the first redistribution portion 110 to the upper surface of the thermal conductive layer 130 may be equal or similar to a first height D1 from the upper surface of the first redistribution portion 110 to the upper surface of the core layer 140. For example, even when the second height D2 is greater than the first height D1, the second height D2 may be equal to or lower than a height from the upper surface of the first redistribution portion 110 to an upper surface of second upper wiring layers 162b.

The thermal conductive layer 130 may be made of a material having higher thermal conductivity than that of the semiconductor chip 120, thereby emitting heat generated by the semiconductor chip 120 upwardly. For example, thermal conductivity of the semiconductor chip 120 may range from about 100 W/mK to 130 W/mK, and thermal conductivity of the thermal conductive layer 130 may range from about 360 W/mK to 410 W/mK, but are not limited thereto. The thermal conductive layer 130 may be made of, for example, a metal such as copper (Cu). In the example embodiments, the thermal conductive layer 130 may be made of the same material as the upper wiring layers 162a and 162b of the second redistribution portion 160.

As shown in FIG. 3, a thermal conductive layer 130 may have the same size as that of a semiconductor chip 120 in a plan view, and a side surface of the thermal conductive layer 130 may be coplanar with a side surface of the semiconductor chip 120. In certain embodiments, the four side surfaces of the thermal conductive layer 130 may be coplanar with respective side surfaces of the semiconductor chip 120. A thickness T2 of the thermal conductive layer 130 may be lower than a thickness T1 of the semiconductor chip 120, and may be in the range of 10% to 40% of the thickness T1 of the semiconductor chip 120, for example, but is not limited thereto. When the thickness T2 of the thermal conductive layer 130 is relatively large, the thermal conductive layer 130 may not be disposed in the through-hole CA, so that a thickness of the semiconductor package 100 may be increased. When the thickness T2 of the thermal conductive layer 130 is relatively small, a heat dissipation function by the thermal conductive layer 130 may be reduced.

The sealing layer 150 may occupy a space in the through-hole CA of the core layer 140 to seal the through-hole CA, and may extend to the upper surfaces of the core layer 140 and the thermal conductive layer 130. The sealing layer 150 may occupy a space between the semiconductor chip 120 and the inside wall of the through-hole CA, and at least a portion of a space between the cover layer 123 of the semiconductor chip 120 and the first redistribution portion 110. For example, the sealing layer 150 may fill a gap between a sidewall of the through-hole CA and the semiconductor chip 120 and/or the thermal conductive layer 130. Accordingly, the sealing layer 150 may also serve as an adhesive layer, e.g., between the layers mentioned above. The sealing layer 150 may be made of an insulating material, for example, an epoxy resin, polyimide, or the like.

The second redistribution portion 160, also described as a redistribution pattern, may be disposed on the upper portion of the semiconductor chip 120, e.g., on/above the semiconductor chip 120, and be electrically connected to the semiconductor chip 120 and the first redistribution portion 110 through the core wiring layer 142 of the core layer 140.

Accordingly, the second redistribution portion 160 may also serve to redistribute the connection pads 122. For example, the second redistribution portion 160 may be electrically connected to the connection pads 122. The second redistribution portion 160 may include first and second upper wiring layers 162a and 162b and first and second upper vias 164a and 164b. The first and second upper wiring layers 162a and 162b may be disposed at the same height level, e.g., with respect to a first plane including the lower surface of the semiconductor chip 120 on which the connection pads 122 are formed. For example, the height level may be a vertical distance of the first and second upper wiring layers 162a and 162b from the first plane. The first upper wiring layer 162a and the first upper vias 164a may be disposed on the upper portions of the semiconductor chip 120, e.g., on/above the semiconductor chip 120, and may be connected to the thermal conductive layer 130. The second upper wiring layers 162b and the second upper vias 164b may be disposed on the upper portion of the core layer 140 to be electrically connected to the semiconductor chip 120. For example, the second upper wiring layers 162b and the second upper vias 164b may be formed on/over the core insulation layer 141 and/or the core wiring layers 142.

As shown in FIG. 3, the first upper wiring layer 162a may have the same size and shape as the semiconductor chip 120 and the thermal conductive layer 130, for example, a square shape, but is not limited thereto. In the example embodiments, a length L1 in at least one direction of the first upper wiring layer 162a may be equal to or greater than a length L2 in one direction of the thermal conductive layer 130. For example, the first upper wiring layer 162a may have a larger size than the thermal conductive layer 130. In certain embodiments, the first upper wiring layer 162a may be formed of a plurality of line patterns arranged at the same height, e.g., with respect to the first plane.

The first upper wiring layer 162a may be connected to the thermal conductive layer 130 by the first upper vias 164a. The first upper vias 164a may be connected to the thermal conductive layer 130 by penetrating the sealing layer 150. In some example embodiments, the second redistribution portion 160 may include an insulation layer disposed on the upper portion of the sealing layer 150 (e.g., on top of the sealing layer 150 between the first upper wiring layer 162a and the sealing layer 150), in which case the first upper via 164a may be disposed to penetrate the insulation layer and the sealing layer 150, e.g., in a vertical direction. The first upper vias 164a may be arranged in rows and columns, as shown in FIGS. 1 and 3. As shown in FIG. 1, the first upper vias 164a may be arranged to have a smaller pitch than that of the second upper vias 164b, but are not limited thereto. Accordingly, the first upper wiring layer 162a may be disposed on the upper portion of the thermal conductive layer 130, and connected to the thermal conductive layer 130 by the first upper vias 164a, so that a heat dissipation function of the semiconductor package 100 may be further improved by expanding an area performing the heat dissipation function from the thermal conductive layer 130 to the first upper wiring layer 162a.

As shown in FIG. 2, the first upper wiring layer 162a may be physically connected to the second upper wiring layers 162b in at least one area. Accordingly, the first upper wiring layer 162a and the first upper via 164a may be electrically connected to the second upper wiring layers 162b and the second upper vias 164b. In this case, for example, an electrical signal, such as a ground voltage, may be applied to the first upper wiring layer 162a. In this case, the electrical signal may not be transmitted to the semiconductor chip 120 (e.g., to the wirings of the semiconductor chip 120), because the thermal conductive layer 130 contacts the inactive surface of the semiconductor chip 120. Alternatively, a voltage may not be transmitted to the semiconductor chip 120, due to an adhesive layer between the semiconductor chip 120 and the thermal conductive layer 130.

The second redistribution portion 160 may include a conductive material such as copper (Cu), aluminum (Al), silver (Ag), tin (Sn), gold (Au), nickel (Ni), titanium (Ti), or an alloy thereof. The first and second upper vias 164a and 164b may have structures completely filling respective holes with a conductive material, but are not limited thereto, for example, the first and second upper vias 164a and 164b may have shapes in which a conductive material is formed along the walls of the respective holes, and may have various shapes such as a cylindrical shape, a tapered shape or the like.

The first and second passivation layers 170 and 180 may be disposed on the upper surface of the second redistribution portion 160 and the lower surface of the first redistribution portion 110, respectively, and may serve to protect the second redistribution portion 160 and the first redistribution portion 110, respectively. The first and second passivation layers 170 and 180 may be formed of an insulating material, for example, a resin, but are not limited thereto.

The pad metal layer 190 may be disposed to be connected to (e.g., contact) the lower wiring layers 112 exposed through openings of the second passivation layer 180 to electrically connect the first redistribution portion 110 and the connection terminals 195. The pad metal layer 190 may be made of a conductive material, for example, a metal.

The connection terminals 195 may connect the semiconductor package 100 to a main board or the like of an electronic device on which the semiconductor package 100 is mounted. The connection terminals 195 may include at least one of conductive materials, for example, solder, tin (Sn), silver (Ag), copper (Cu), and/or aluminum (Al). A shape of the connection terminals 195 may be a ball shape or other shapes such as a land, a bump, a pillar, a pin, or the like.

Figure 4:
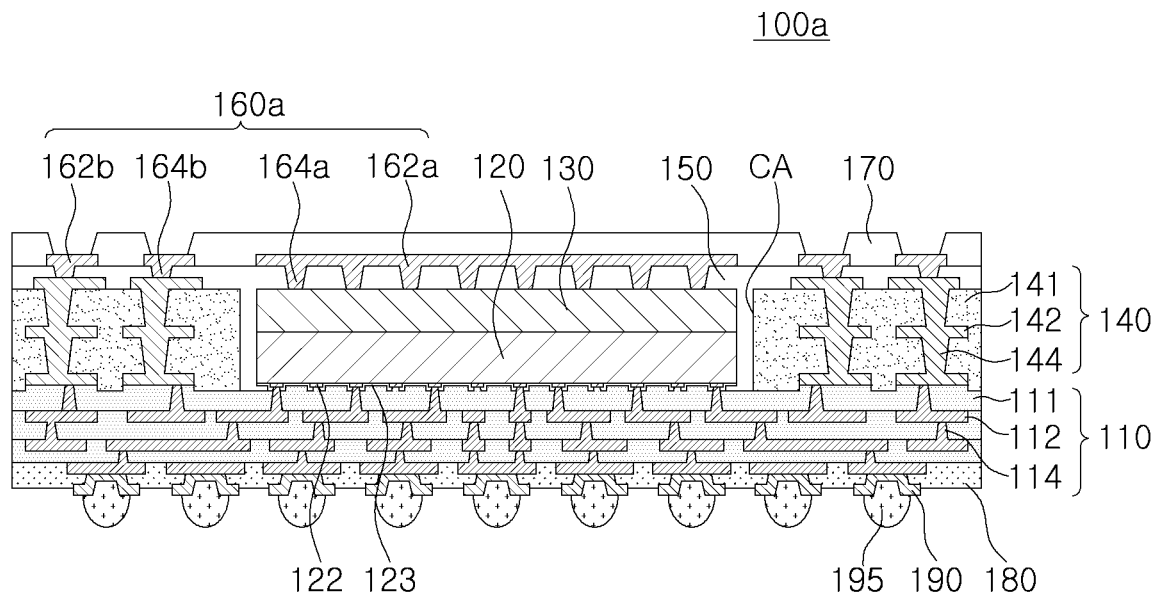
FIGS. 4 to 6 are schematic cross-sectional views of a semiconductor package according to an example embodiment of the present inventive concept.
Figure 5:
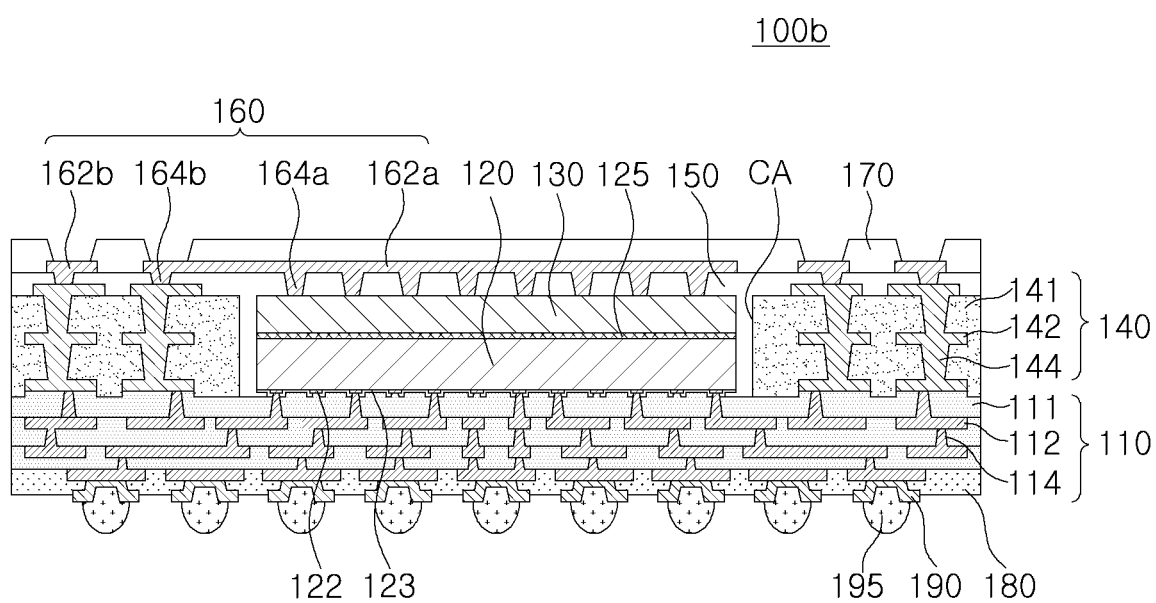
Figure 6:
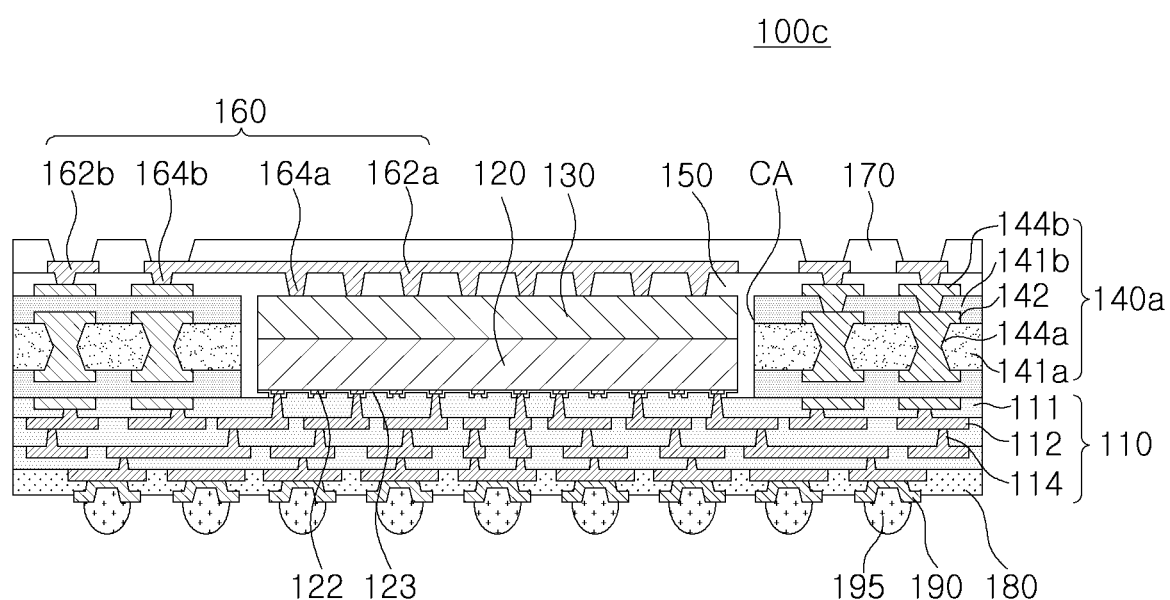

FIGS. 4 to 6 are schematic cross-sectional views of a semiconductor package according to an example embodiment.

Referring to FIG. 4, in a different way than the example embodiments of FIGS. 1 to 3, in a semiconductor package 100a, a first upper wiring layer 162a and a second upper wiring layer 162b in a second portion 160a may be physically and electrically separated/insulated from each other. The second portion 160a, also described as a pattern, may include a redistribution portion (e.g., 162b and 164b) and a dummy redistribution portion (e.g., 162a and 164a), each of which may be described as a pattern. For example, the first upper wiring layer 162a and first upper vias 164a may be a dummy wiring layer and dummy vias, respectively. For example, the redistribution portion (e.g., 162b and 164b) may transfer electric signal and may have an effect to redistribute arrangement of electric signal lines. For example, the dummy redistribution portion (e.g., 162a and 164a) may not transfer electrical signal.

As used herein, the term "dummy" is used to refer to a configuration that has the same or a similar structure and shape as other components, but exists only in a pattern without having a substantial function in a device. The first upper wiring layer 162a and the first upper via 164a are not electrically connected to the semiconductor chip 120 and the wiring structures including the second upper wiring layers 162b in the semiconductor package 100, but may exist as a pattern without receiving an electrical signal, e.g., while the semiconductor chip 120 operates. The first upper wiring layer 162a and the first upper vias 164a of the second portion 160a together with the thermal conductive layer 130 may serve to emit heat generated by the semiconductor chip 120 externally, and to prevent warpage of the semiconductor package 100. In certain embodiments, a ground signal may be applied to the first upper wiring layer 162a and the first upper vias 164a.

Referring to FIG. 5, a semiconductor package 100b may further include a barrier layer 125 disposed between a semiconductor chip 120 and a thermal conductive layer 130, in a different way than the example embodiments of FIGS. 1 to 3.

The barrier layer 125 may be a diffusion barrier layer interposed between the thermal conductive layer 130 and the semiconductor chip 120 so that a material of the thermal conductive layer 130 is not diffused into the semiconductor chip 120, or may be a protective layer for protecting the semiconductor chip 120 at the interface between the thermal conductive layer 130 and the semiconductor chip 120. A material of the barrier layer 125 may be selected depending on a material of the thermal conductive layer 130, and may be made of a thermal conductive material. The barrier layer 125 may comprise, for example, titanium (Ti), tantalum (Ta), nickel (Ni), tungsten (W) and/or one or more alloys thereof. The barrier layer 125 may comprise a single layer or multiple layers.

Referring to FIG. 6, in a semiconductor package 100c, the number of core insulation layers 141a and 141b and core wiring layers 142 forming a core layer 140a may be different from that of the example embodiments of FIGS. 1 to 3, and the number, shape, and the like of core vias 144a and 144b may be in a different way than the example embodiments of FIGS. 1 to 3.

The core layer 140a may be formed by forming the first core via 144a penetrating upper and lower surfaces of the first core insulation layer 141a, by forming the core wiring layers 142 disposed on the upper and lower surfaces, and by forming then the second core insulation layers 141b on the upper and lower surfaces of the first core insulation layer 141a to cover the respective upper and lower surfaces of the first core insulation layer 141a. Next, the core wiring layers 142 may be formed on the upper and lower surfaces of the second core insulation layers 141b, respectively. For example, a portion of the core wiring layers 142 may be formed on the upper surface of the second core insulation layer 141b formed on the upper surface of the first core insulation layer 141a, and another portion of the core wiring layers 142 may be formed on the lower surface of the second core insulation layer 141b formed on the lower surface of the first core insulation layer 141a. The second core insulation layers 141b may expose a portion of the first core vias 144a. In certain embodiments, some core vias 144a may be fully covered by the second core insulation layers 141b as shown in FIG. 6. Second vias 144b may be formed through the second core insulation layers 141b. For example, the core layer 140a may have a structure that is manufactured in a cored form. For example, the first core insulation layer 141 may be enclosed within the second core insulation layers 141b.

Therefore, the core layer 140a may have a structure in which the core wiring layers 142 are disposed at the top and bottom of the core layer 140a, without having the core wiring layers 142 embedded in the first core insulation layer 141a. In the example embodiments, the number of the core insulation layers 141a and 141b and the core wiring layer 142 stacked up and down around the first core insulation layer 141a may be variously changed. For example, two or more second core insulation layers 141b and two or more core wiring layers 142 may be stacked on each side of the first core insulation layer 141a.

Figure 7:
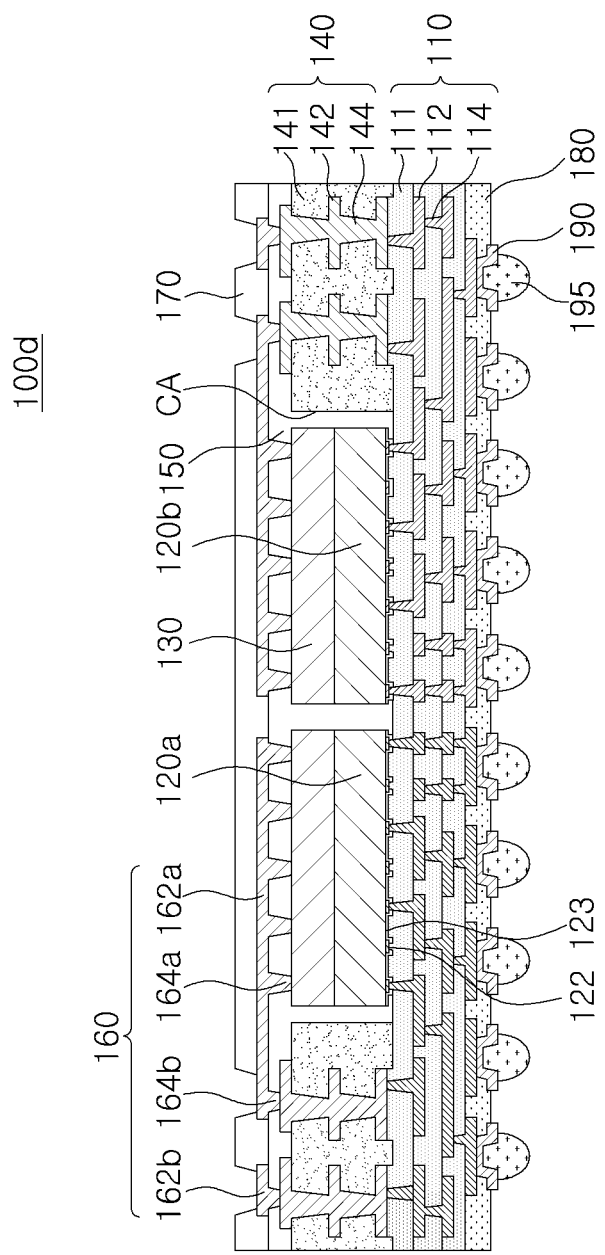
FIGS. 7 and 8 are schematic cross-sectional views of a semiconductor package according to an example embodiment of the present inventive concept.
Figure 8:
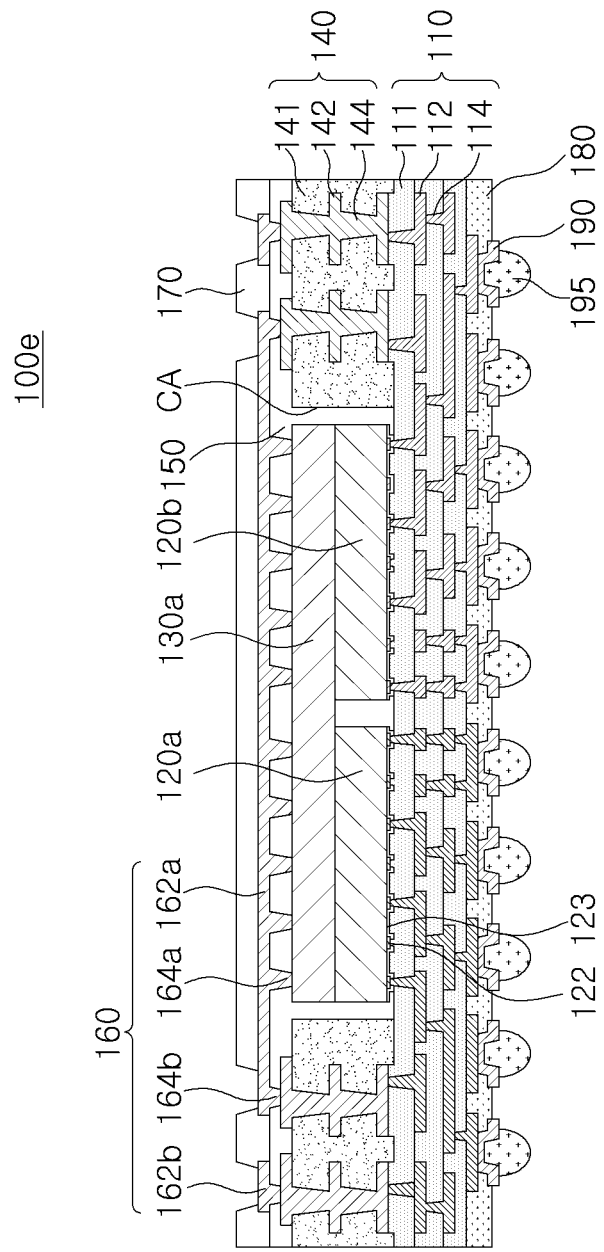

FIGS. 7 and 8 are schematic cross-sectional views of a semiconductor package according to an example embodiment.

Referring to FIG. 7, a semiconductor package 100d may include a plurality of semiconductor chips 120a and 120b and a plurality of thermal conductive layers 130, in a different way than the example embodiments of FIGS. 1 to 3.

The semiconductor chips 120a and 120b may be arranged in parallel in a through-hole CA of a core layer 140. Thermal conductive layers 130 may be arranged on upper surfaces of the respective semiconductor chips 120a and 120b at substantially the same size as the semiconductor chips 120a and 120b, e.g., in a plan view. For example, the thermal conductive layers 130 may have the same areas as the respective semiconductor chips 120a and 120b in a plan view.

First upper wiring layers 162a and first upper vias 164a may be arranged on respective upper portions of the thermal conductive layers 130, and connected to the thermal conductive layers 130. For example, the first upper vias 164a may respectively contact corresponding thermal conductive layers 130. In at least one area, the first upper wiring layers 162a may be electrically connected to second upper wiring layers 162b electrically connected to the semiconductor chips 120a and 120b. FIG. 7 shows that the first upper wiring layers 162a are not connected to each other between the semiconductor chips 120a and 120b, but is not limited thereto. Depending onthe example embodiments, the first upper wiring layers 162a may be arranged to be connected to each other between the semiconductor chips 120a and 120b. For example, the semiconductor chips 120a and 120b may be electrically connected to each other, e.g., through the first upper wiring layers 162a.

Referring to FIG. 8, a semiconductor package 100e may include a plurality of semiconductor chips 120a and 120b and a thermal conductive layer 130a, in a different way/form than the example embodiment of FIG. 7.

The thermal conductive layer 130a may be disposed as a single layer on upper surfaces of the semiconductor chips 120a and 120b, thereby extending between the semiconductor chips 120a and 120b, e.g., in a plan view. The thermal conductive layer 130a may be made of, for example, copper foil, but is not limited thereto. Accordingly, the thermal conductive layer 130a may be extended and disposed between the semiconductor chips 120a and 120b, e.g., in a plan view, and, thereby, a heat dissipation function may be further improved. For example, the thermal conductive layer 130a may extend over the semiconductor chips 120a and 120b and may contact the upper surfaces of the semiconductor chips 120a and 120b. For example, the thermal conductive layer 130a may fully cover the semiconductor chips 120a and 120b in a plan view.

First upper wiring layers 162a and first upper vias 164a may be arranged on the thermal conductive layer 130a, and may be arranged on an area between the semiconductor chips 120a and 120b. For example, the first upper wiring layers 162a formed over the semiconductor chip 120a may extend over the semiconductor chip 120b, thereby forming a continuous pattern of the first upper wiring layers 162a.

Figure 9:
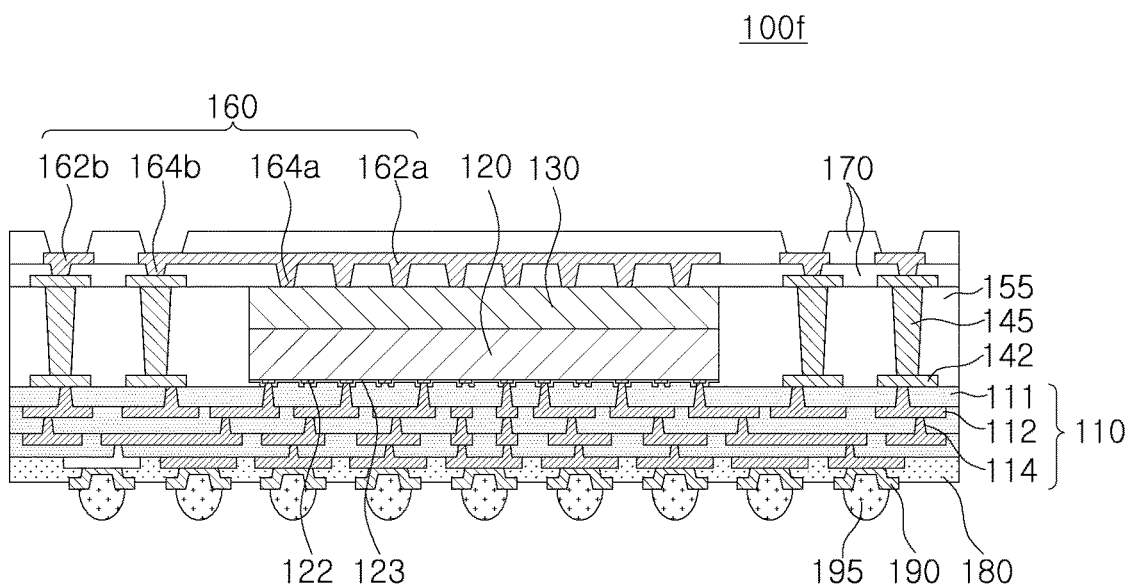
FIG. 9 is a schematic cross-sectional view of a semiconductor package according to an example embodiment of the present inventive concept.

FIG. 9 is a schematic cross-sectional view of a semiconductor package according to an example embodiment.

Referring to FIG. 9, a semiconductor package 100f may not include a core layer 140 and a sealing layer 150, which is different from the example embodiment of FIGS. 1 to 3. The semiconductor package 100f may include an encapsulating layer 155 for encapsulating a semiconductor chip 120 and a thermal conductive layer 130.

The encapsulating layer 155 may be disposed to cover an upper surface of a first redistribution portion 110, and to surround side surfaces of the semiconductor chip 120 and the thermal conductive layer 130. For example, the encapsulating layer 155 may be disposed between the first redistribution portion 110 and a second redistribution portion 160. An upper surface of the encapsulating layer 155 may be coplanar with an upper surface of the thermal conductive layer 130, but is not limited thereto. The encapsulating layer 155 may be made of, for example, a silicone-based material, a thermosetting material, a thermoplastic material, a UV treatment material, or the like. The encapsulating layer 155 may be made of a resin material, and may be formed of, for example, an epoxy molding compound (EMC).

The first and second redistribution portions 110 and 160 disposed on the upper and lower portions of the encapsulating layer 155 are electrically connected to each other by a through-via 145 penetrating the encapsulating layer 155 and a wiring layer 142 disposed on the lower portion of the encapsulating layer 155. In the example embodiments, the wiring layer 142 may be omitted, and the through-via 145 may directly connect lower wiring layers 112 of the first redistribution portion 110 and second upper wiring layers 162b of the second redistribution portion 160. Accordingly, the semiconductor package 100f may be a fan-out type wafer level semiconductor package that does not include a core layer 140.

Figure 10:
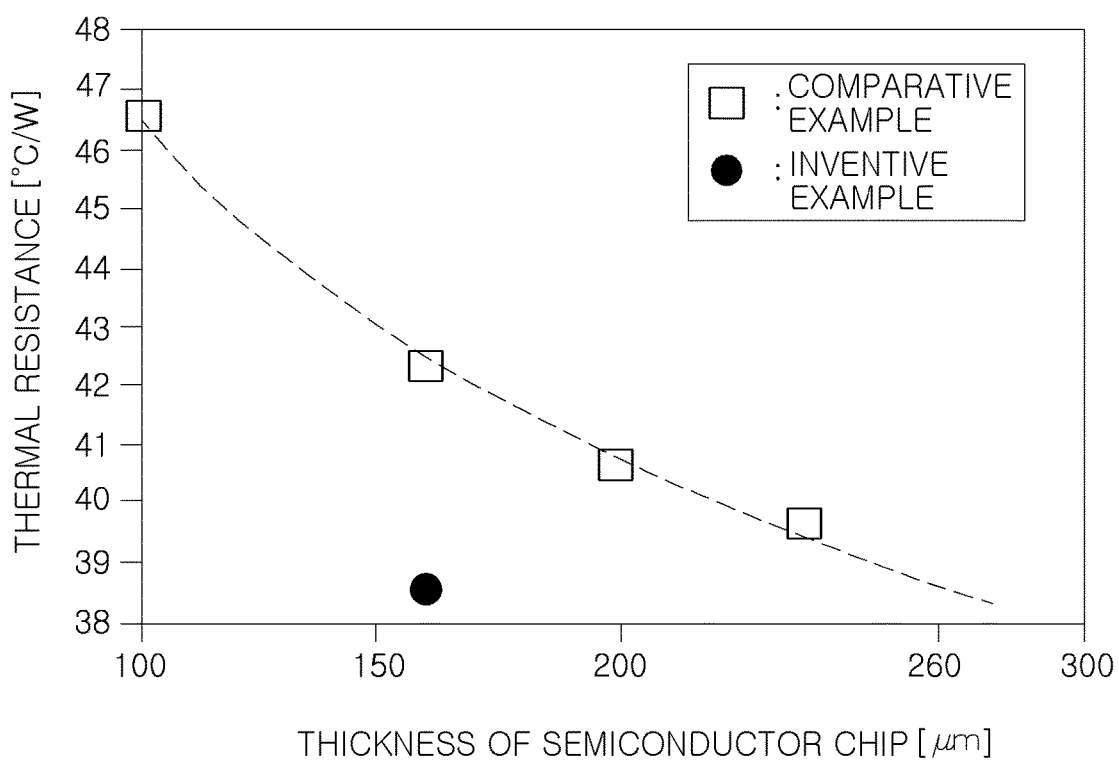
FIG. 10 is a graph for explaining heat dissipation characteristics of a semiconductor package according to an example embodiment of the present inventive concept.

FIG. 10 is a graph for explaining heat dissipation characteristics of a semiconductor package according to an example embodiment.

Referring to FIG. 10, the graph represents a measurement result of thermal resistances according to thicknesses of semiconductor chips according to comparative examples together with a measurement result of a thermal resistance of a semiconductor chip structure of an example embodiment of current disclosure. The comparative examples have a structure made only of a silicon-based semiconductor chip, while the example embodiment has a structure in which a thermal conductive layer of copper is formed on a silicon-based semiconductor chip. In the example embodiment, the thickness of the semiconductor chip is 160 μm, and the thickness of the thermal conductive layer is 40 μm.

As shown in FIG. 10, in the comparative examples, the thermal resistance tends to decrease as the thickness of the semiconductor chip increases. In the case of the inventive example, it shows that although the total thickness of the semiconductor chip structure is 200 μm, the thermal resistance value corresponds to the case in which the thickness of the semiconductor chip is about 260 μm in the curve of the graph. According to such results, it can be seen that even though the total thickness of the semiconductor chip structure is increased by 40 μm from the semiconductor chip with thickness of 160 μm, the thermal resistance thereof is the same as that in the case in which the thickness of the semiconductor chip is increased by 100 μm, in which the thickness increase of the latter case is 2.5 times of the thickness increase of the former case. For example, the example embodiment has an effect to reduce total thicknesses of semiconductor packages by using the thermal conductive layer.

Such a heat resistance characteristic may be due to the properties of the thermal conductivities of the semiconductor chip 120 and the thermal conductive layer 130, as follows: since the thermal conductivity of the silicon-based semiconductor chip is about 117 W/mK, while the thermal conductivity of the thermal conductive layer made of copper is about 385 W/mK which is three or more times that of the semiconductor chip. In another aspect, heat emitted from the central portion of the semiconductor chip maybe efficiently dissipated in the horizontal direction along the thermal conductive layer at the upper portion of the semiconductor chip, so that the heat emission efficiency may be further increased. For example, the thermal conductive layer 130 may efficiently spread heat generated locally to the whole area of the thermal conductive layer 130 by virtue of its high thermal conductivity, thereby efficiently dissipating the heat toward outside the semiconductor package.

FIGS. 11A to 11H are schematic views of respective steps illustrating a method of manufacturing a semiconductor package according to an example embodiment.

Figure 11A:
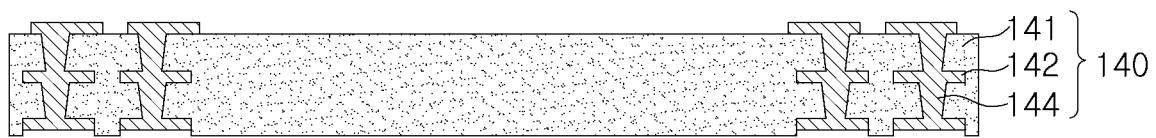
FIGS. 11A to 11H are schematic views illustrating steps of a method of manufacturing a semiconductor package according to an example embodiment of the present inventive concept.

Referring to FIG. 11A, a core layer 140 may be prepared.

The core layer 140 may be made by forming a plurality of insulation layers forming a core insulation layer 141 on a carrier substrate or the like, by forming core vias 144 penetrating the insulation layer and core wiring layers 142 on the insulation layer sequentially, and by removing the carrier substrate therefrom. In certain embodiments, the core layer 140 may be formed by repeating the above described steps to form multiple layers of wiring layers 142, multiple layers of vias 144, and/or multiple layers of core insulation layers 141. In the example embodiments, a structure of the core layer 140 may be changed into various structures including the example embodiment of FIG. 6, depending on a function of a semiconductor package, a manufacturing process of a core layer 140, or the like.

Figure 11B:
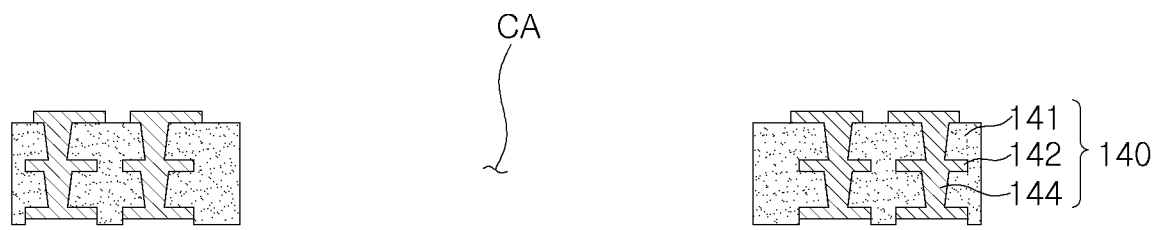

Referring to FIG. 11B, a through-hole CA penetrating upper and lower surfaces of the core layer 140 may be formed in the core layer 140.

The through-hole CA may be formed at the center of the core layer 140. For example, the through-hole CA may be surrounded by the core layer 140 in a plan view. A size and shape of the through-hole CA may be changed depending on a size, shape, number, or the like of a semiconductor chip 120 to be mounted. For example, the plan view area of the through-hole CA may be less than 120% of the plan view area of the semiconductor chip 120 (or the sum of all plan view areas of the semiconductor chips in case multiple semiconductor chips are disposed on a through-hole CA). The through-hole CA may be formed by mechanical drilling and/or laser drilling the core layer 140. Alternatively, the through-hole CA may be formed by a sand blasting method using abrasive particles, a dry etching method using plasma, or the like.

Figure 11C:
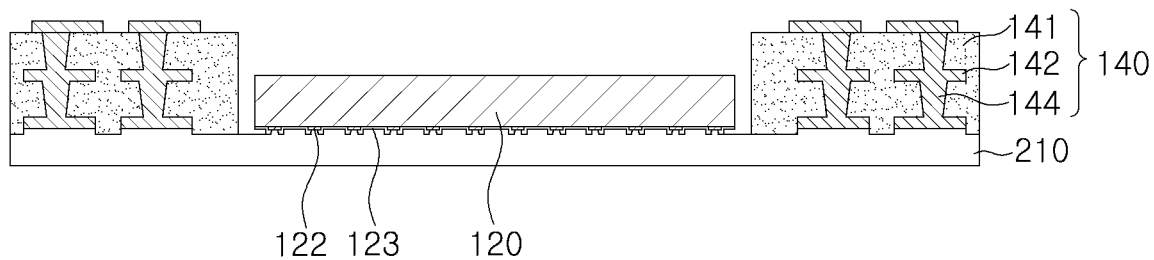

Referring to FIG. 11C, an adhesive layer 210 may be attached to a lower surface of the core layer 140, and a semiconductor chip 120 may be disposed in the through-hole CA, e.g., on the adhesive layer 210.

The adhesive layer 210 may be provided to fix the core layer 140, and, may use, for example, a thermosetting or ultraviolet ray-curable adhesive tape. The semiconductor chip 120 may be attached to the adhesive layer 210 in the through-hole CA. The semiconductor chip 120 may be disposed in a face-down form such that connection pads 122 are attached to the adhesive layer 210.

Figure 11D:
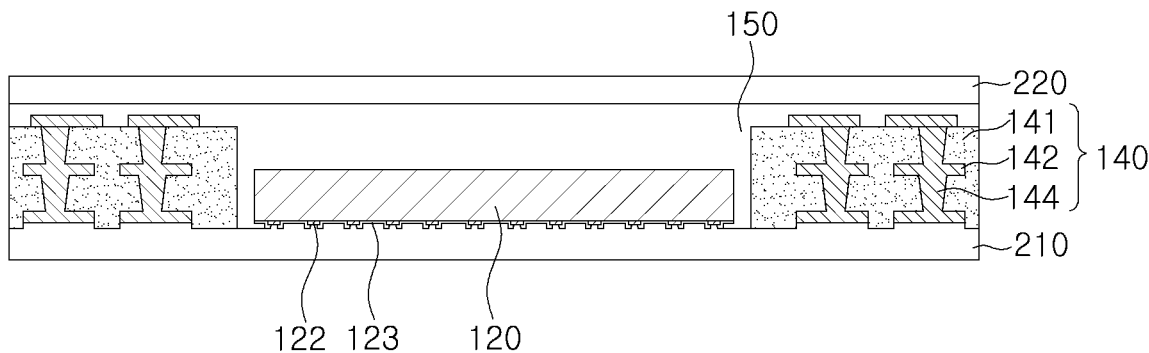

Referring to FIG. 11D, a sealing layer 150 may be formed, and a first support layer 220 may be formed on the upper portion of the semiconductor chip 120.

The sealing layer 150 may be formed to seal the upper and side surfaces of the core layer 140 and the semiconductor chip 120, and to fill the space in the through-hole CA. The sealing layer 150 may be formed by placing a material forming the sealing layer 150 on the semiconductor chip 120 using a lamination method, a coating method, or the like, and then curing the material. The coating method may be, for example, a screen printing method or a spray printing method.

The first support layer 220 may be formed on the sealing layer 150, and may be formed to support a structure comprising the semiconductor chip 120, the core layer 140, and the sealing layer 150 during a subsequent process. The first support layer 220 may comprise various materials which may be easily removed in a subsequent process. For example, the first support layer 220 may include a thermosetting resin such as an epoxy resin, or a thermoplastic resin such as polyimide, but is not limited thereto.

Figure 11E:
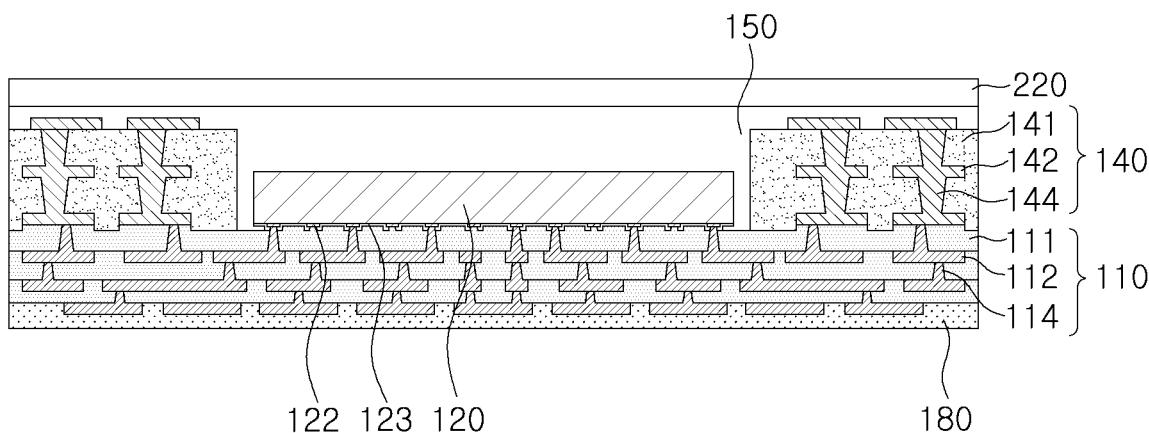

Referring to FIG. 11E, the adhesive layer 210 may be removed from the lower portion of the semiconductor chip 120 to form a first redistribution portion 110 and a second passivation layer 180. For example, after removing the adhesive layer 210 from the lower portion of the semiconductor chip 120, the first redistribution portion 110 and the second passivation layer 180 may be sequentially formed on the lower portion of the semiconductor chip 120.

The first redistribution portion 110 may be formed by sequentially forming lower insulation layers 111. After forming the lower insulation layers 111, on a lower surface of the semiconductor chip 120 and on a lower surface of the core layer 140, lower wiring layers 112 and lower vias 114 may be formed to prepare the first redistribution portion 110. For example, the first redistribution portion 110 may include plural layers of lower wiring layers 112, plural layers of lower visa 114, and plural layers of lower insulation layers 111 alternately stacked as shown in FIG. 11E.

The second passivation layer 180 may be formed to cover a lower surface of the first redistribution portion 110. The second passivation layer 180 may be formed by placing a material forming the second passivation layer 180 using a lamination method, a coating method, or the like, and then curing the material. Alternatively, the second passivation layer 180 may be also formed by a vapor deposition method.

Figure 11F:
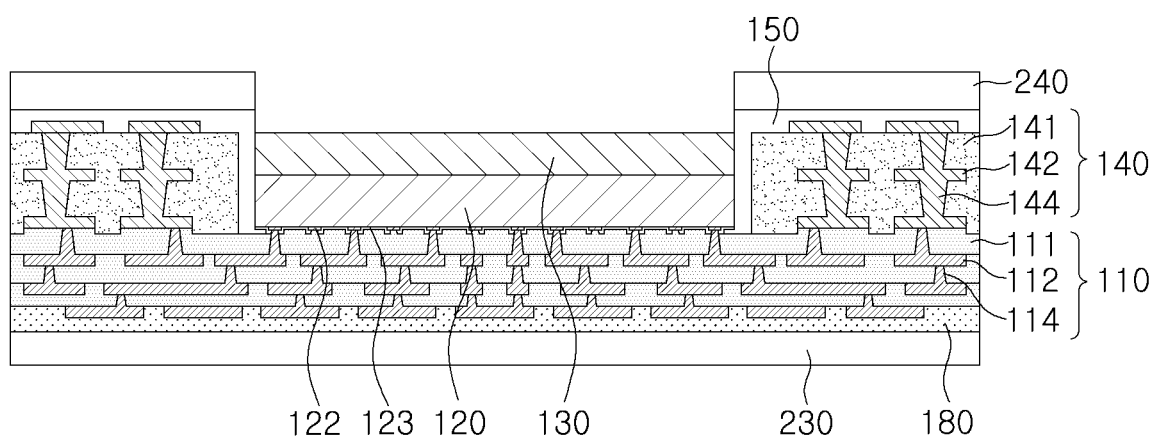

Referring to FIG. 11F, the first support layer 220 may be removed from the upper portion of the semiconductor chip 120, and a thermal conductive layer 130 may be formed on the semiconductor chip 120.

First, a second support layer 230 may be formed on the lower portion of the second passivation layer 180 to support the upper structures. In certain example embodiments, the second support layer 230 may be omitted. Next, a portion of the first support layer 220 on the sealing layer 150 may be removed, and a patterned mask layer 240 formed with the first support layer 220 may be formed on the sealing layer 150. For example, the patterned mask layer 240 may expose a portion of the sealing layer 150 overlapping the semiconductor chip 120. In certain embodiments, the edge line of the patterned mask layer 240 may be the same as the edge line of the semiconductor chip 120 in a plan view.

The sealing layer 150 formed on the upper surface of the semiconductor chip 120 may be removed using the mask layer 240 to form the thermal conductive layer 130. The sealing layer 150 on the semiconductor chip 120 may be removed by an etching process, and the thermal conductive layer 130 may be formed on the upper surface of the thus exposed semiconductor chip 120 by a vapor deposition method or a plating method. For example, the edge lines of the sealing layer 150 at the removed portion may be the same as the edge line of the semiconductor chip 120 in a plan view, thereby the edge line of the thermal conductive layer 130 being the same as the edge line of the semiconductor chip 120 in the plan view. In the case of the semiconductor package 100b according to the example embodiment of FIG. 5, the barrier layer 125 may be formed before forming the thermal conductive layer 130 in this step. Depending on a method of forming the thermal conductive layer 130, a material forming the thermal conductive layer 130 may be also formed on the mask layer 240, and may be removed at the same time upon removal of the mask layer 240.

Although the method of forming the thermal conductive layer 130 before a formation of a second redistribution portion 160 has been described as an example in the present example embodiment, a formation order of the thermal conductive layer 130 is not limited thereto. For example, the thermal conductive layer 130 may be formed by laminating a copper foil, and, in this case, by attaching it to the semiconductor chip 120 in advance during the above-described process with reference to FIG. 11C, the sealing layer 150 may be formed after the semiconductor chip 120 and the thermal conductive layer 130 are disposed in the through-hole CA of the core layer 140.

Figure 11G:
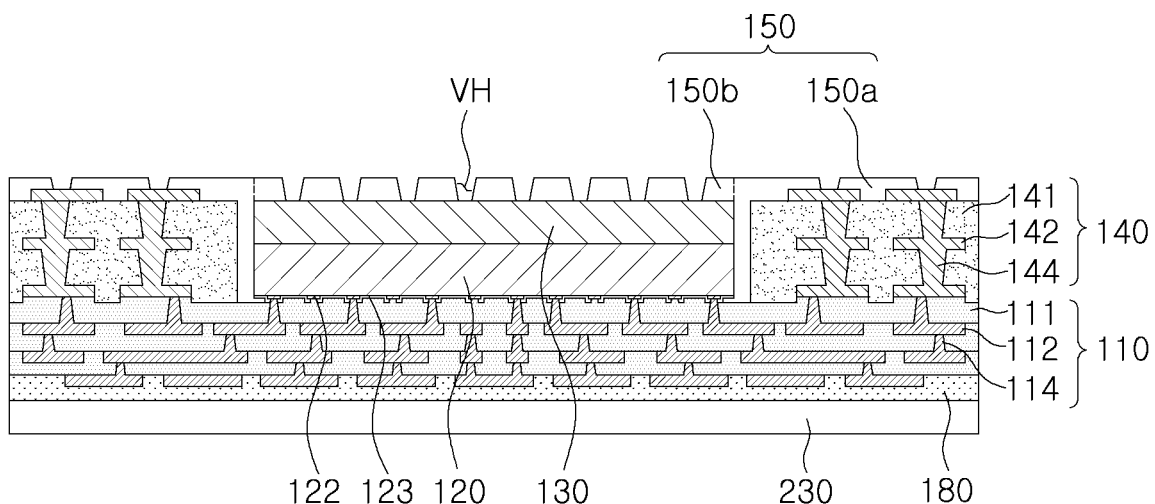

Referring to FIG. 11G, a second portion 150b of the sealing layer 150 may be further formed on the semiconductor chip 120 to form the sealing layer 150 together with a first portion 150a on the core layer 140, and via holes VH may be formed in the sealing layer 150. Because the first portion 150a and the second portion 152b of the sealing layer 150 are formed by different steps from each other, the first and second portions 150a and 150b may be described as different layers, e.g., first and second sealing layers, in certain embodiments.

In the case of the present example embodiment, as the thermal conductive layer 130 is formed after mounting of the semiconductor chip 120 and after the sealing layer 150 is removed from the upper portion of the semiconductor chip 120, the second portion 150b of the sealing layer 150 is formed after the formation of the thermal conductive layer 130. While in some example embodiments, the first and second portions 150a and 150b may be formed with the same material, in certain embodiments, the two portions 150a and 150b of the sealing layer 150 may be made of different materials. For example, in the example embodiment in which the thermal conductive layer 130 is attached to the semiconductor chip 120 before the formation of the sealing layer 150 and disposed together in the through-hole CA, as described above, the sealing layer 150 may be formed as a single layer, e.g., including the same material throughout the single layer.

The via holes VH may be formed by patterning the sealing layer 150 using photolithography or by using mechanical drilling or laser drilling. The via holes VH may be formed to expose the thermal conductive layer 130 and the core wiring layer 142 in a position in which first and second upper vias 164a and 164b are subsequently formed.

Figure 11H:
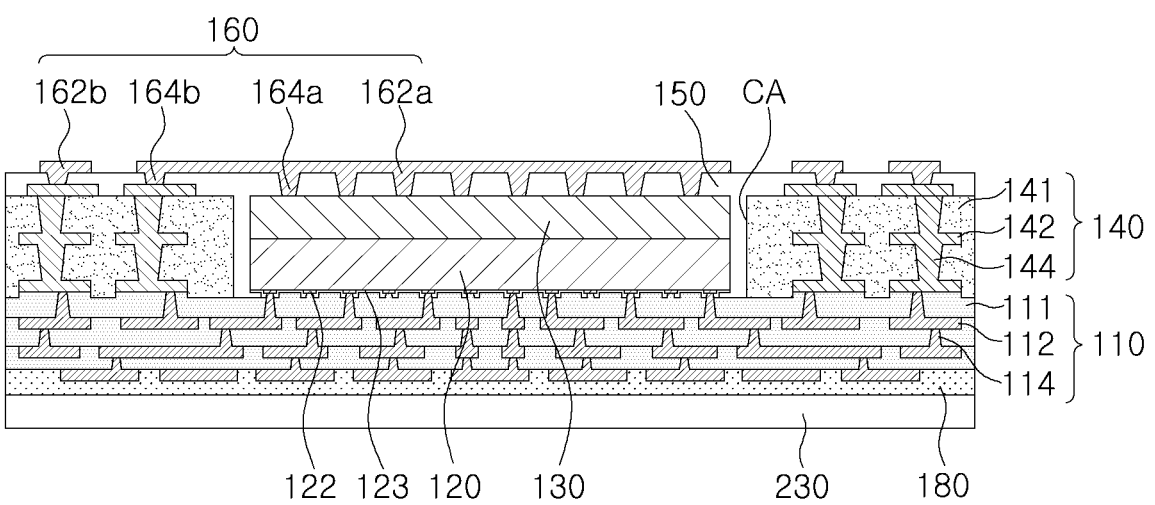

Referring to FIG. 11H, first and second upper vias 164a and 164b and first and second upper wiring layers 162a and 162b may be formed to form a second redistribution portion 160.

The first and second upper vias 164a and 164b may be formed to fill the via hole VH, and may be formed by a plating process. The first and second upper wiring layers 162a and 162b may be formed by a plating process together with the first and second upper vias 164a and 164b, but are not limited thereto. For example, the first and second upper wiring layers 162a and 162b may be formed by laminating and then patterning a copper foil.

In the present example embodiment, a method of forming a second redistribution portion 160 after the thermal conductive layer 130 is formed is exemplified. Depending on the example embodiments, a process regarding the thermal conductive layer 130 may be carried out with a portion of a process forming the second redistribution portion 160. In the present example embodiment, the first redistribution portion 110 may be first formed, and then the second redistribution portion 160 may be formed. A formation order of the first and second redistribution portions 110 and 160 is not limited to the above mentioned order. In certain example embodiments, after the formation of the sealing layer 150 described above with reference to FIG. 11D, the processes of forming the thermal conductive layer 130 and the second redistribution portion 160 described above with reference to FIGS. 11G to 11H may be performed. Then, the process of forming the first redistribution portion 110 described above with reference to FIG. 11E may be performed.

Next, referring to FIG. 2 together, the first passivation layer 170 having openings may be formed on the second redistribution portion 160. Then, an opening for exposing a portion of the lower wiring layers 112 may be formed on the lower portion of the second passivation layer 180, and the pad metal layer 190 and the connection terminals 195 may be formed on the opening.

The pad metal layer 190 and the connection terminals 195 may be formed by a vapor deposition or a plating process, and the connection terminals 195 may be formed by further using a reflow process.

The above processes may be performed on a wafer level or a panel level, and then the semiconductor package 100 of FIG. 2 may be manufactured by separating each of the semiconductor packages through a sawing process.

Figure 12:
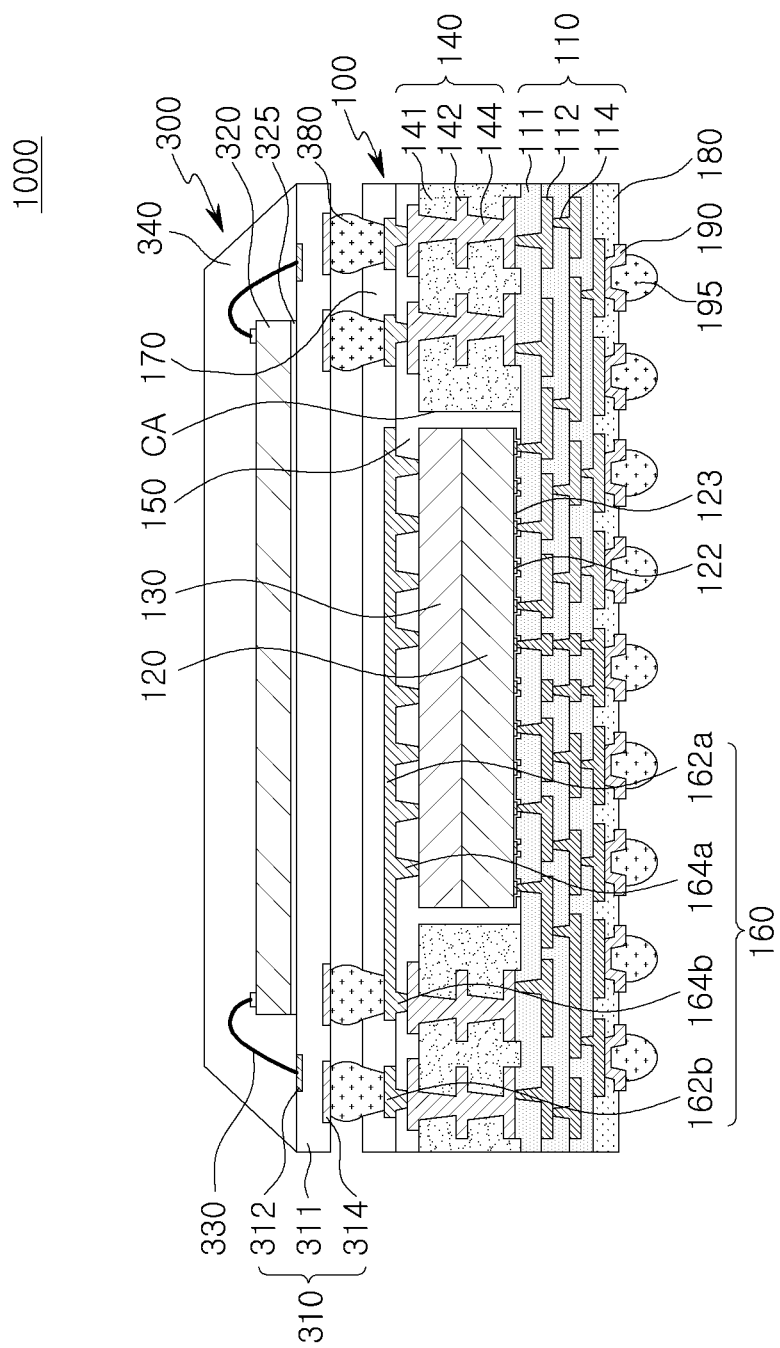
FIG. 12 is a schematic cross-sectional view of a semiconductor package according to an example embodiment of the present inventive concept.

FIG. 12 is a schematic cross-sectional view of a semiconductor package according to an example embodiment.

Referring to FIG. 12, a semiconductor package 1000 may further include a second semiconductor package 300 disposed on a first semiconductor package 100, in a different way than the example embodiment of FIG. 2. For example, the semiconductor package 1000 may be a package on package (POP) type in which the second semiconductor package 300 is stacked on the first semiconductor package 100.

The first semiconductor package 100 may have the same structure as the semiconductor package 100 described above with reference to FIG. 2, but is not limited thereto. In the example embodiments, the first semiconductor package 100 may employ any of the semiconductor packages 100a, 100b, 100c, 100d, 100e, and 100f described above with reference to FIGS. 4 to 10.

The second semiconductor package 300 may include a substrate 310, an upper semiconductor chip 320, a connection portion 330, an upper encapsulating portion 340, and upper connection terminals 380.

The substrate 310 may include a body portion 311, upper pads 312 to be exposed through an upper surface thereof, and lower pads 314 to be exposed through a lower surface thereof. The substrate 310 may include, for example, silicon (Si), glass, ceramic, or plastic. The substrate 310 may be a single layer, or may have a multilayer structure including wiring patterns therein.

The upper semiconductor chip 320 may include a logic semiconductor chip and/or a memory semiconductor chip. An upper surface of the upper semiconductor chip 320 may be an active surface, but an arrangement position of the active surface may vary in the example embodiments.

The connection portion 330 may electrically connect the upper semiconductor chip 320 to the upper pads 312 of the substrate 310. The connection portion 330 may include wires, but is not limited thereto, and may include various types of signal transmission media. An adhesive layer 325 may serve to attach the upper semiconductor chip 320 to the substrate 310.

The upper encapsulating portion 340 may be disposed to encapsulate the upper semiconductor chip 320, and may serve to protect the upper semiconductor chip 320. The upper encapsulating portion 340 may be made of, for example, a silicone-based material, a thermosetting material, a thermoplastic material, a UV treatment material, or the like.

The upper connection terminals 380 may be disposed on the lower surface of the substrate 310. The upper connection terminals 380 may connect the second semiconductor package 300 to the first semiconductor package 100 disposed under the second semiconductor package 300 so that the first and second semiconductor packages 100 and 300 are electrically connected to each other. The upper connection terminals 380 may include at least one conductive material such as a solder, tin (Sn), silver (Ag), copper (Cu), and aluminum (Al).

The structure of the second semiconductor package 300 described above may be exemplary, and semiconductor packages having various structures may be stacked on the first semiconductor package 100. In certain example embodiments, an interposer substrate may be further disposed between the first semiconductor package 100 and the second semiconductor package 300.

By including a thermal conductive layer, and an upper wiring layer connected thereto, the reliability of a semiconductor package may be improved.

The present invention is not limited by the above-described embodiments and the accompanying drawings, but is intended to be limited only by the appended claims. Accordingly, it is intended that substitutions, modifications and variations could be made without departing from the scope of the present invention as defined by the appended claims.

What is claimed is:

1. A semiconductor package comprising:
  a first semiconductor chip having a first surface that is an active surface and a second surface opposing the first surface,
  a first redistribution portion disposed on the first surface, the first redistribution portion including a lower wiring layer electrically connected to the first semiconductor chip,
  a thermal conductive layer disposed on the second surface of the first semiconductor chip,
  a sealing layer surrounding a side surface of the first semiconductor chip and a side surface of the thermal conductive layer,
  a second redistribution portion disposed on the sealing layer, the second redistribution portion including a first upper wiring layer connected to the thermal conductive layer, the second redistribution portion including a second upper wiring layer electrically connected to the first semiconductor chip, and
  a dummy redistribution portion that includes part of the first upper wiring layer, which art is a dummy wiring layer to which no electrical signal is applied,
  wherein the second redistribution portion further includes a first upper via and a second upper via, and
  wherein the first upper via is disposed between the first upper wiring layer and the thermal conductive layer, and the second upper via is disposed on a lower surface of the second upper wiring layer and has a height smaller than a height of the first upper via.

2. The semiconductor package of claim 1, wherein the side surface of the thermal conductive layer is coplanar with the side surface of the first semiconductor chip.

3. The semiconductor package of claim 1, wherein an upper surface of the thermal conductive layer contacts the first upper via and the sealing layer.

4. The semiconductor package of claim 1, wherein a thickness of the thermal conductive layer is lower than a thickness of the first semiconductor chip.

5. The semiconductor package of claim 1, wherein a ground signal is applied to the first upper wiring layer.

6. The semiconductor package of claim 1, wherein the first and second upper wiring layers are disposed at a same height level with respect to a plane including the first surface of the first semiconductor chip.

7. The semiconductor package of claim 1, further comprising a barrier layer disposed between the first semiconductor chip and the thermal conductive layer, the barrier layer including a metal.

8. The semiconductor package of claim 1, further comprising a core layer having a through-hole into which the first semiconductor chip is mounted,
  wherein the sealing layer fills between the first semiconductor chip and a sidewall of the through-hole.

9. The semiconductor package of claim 8, wherein the thermal conductive layer is disposed in the through-hole.

10. The semiconductor package of claim 8, wherein the core layer comprises a core via that penetrates at least a portion of the core layer and electrically connects the first and second redistribution portions.

11. The semiconductor package of claim 10, wherein the core layer further comprises a core wiring layer electrically connected to the core via.

12. The semiconductor package of claim 1, further comprising a second semiconductor chip disposed in in parallel with the first semiconductor chip in a plan view, and the thermal conductive layer is disposed as a single layer on the first and second semiconductor chips.

13. A semiconductor package comprising:
  a core layer having a through-hole,
  a semiconductor chip having a first surface that is an active surface and a second surface opposing the first surface, the semiconductor chip mounted in the through-hole of the core layer,
  a first redistribution portion disposed on the first surface, the first redistribution portion including a lower wiring layer electrically connected to the semiconductor chip,
  a thermal conductive layer disposed on the second surface of the semiconductor chip,
  a sealing layer surrounding a side surface of the semiconductor chip and a side surface of the thermal conductive layer, and
  a second redistribution portion disposed on the sealing layer, the second redistribution portion including a first upper wiring layer connected to the thermal conductive layer and a second upper wiring layer electrically connected to the first redistribution portion through the core layer,
  wherein the first upper wiring layer is directly connected to the second upper wiring layer, wherein the core layer includes at least one of a core wiring layer and a core via electrically connected to the second upper wiring layer, wherein the second redistribution portion further includes first upper vias and second upper vias, wherein the first upper vias are disposed between the first upper wiring layer and the thermal conductive layer, and the second upper vias are disposed between the second upper wiring layer and the core wiring layer, and wherein the first upper vias are arranged to have a smaller pitch than a pitch of the second upper vias.

14. The semiconductor package of claim 13, wherein the sealing layer covers a portion of an upper surface of the thermal conductive layer, the side surface of the semiconductor chip, and the side surface of the thermal conductive layer.

15. The semiconductor package of claim 13, wherein the first upper wiring layer and the second upper wiring layer are formed together as an integral part.

16. A semiconductor package comprising:

a semiconductor chip, a first redistribution portion disposed on a lower surface of the semiconductor chip, the first redistribution portion including a lower wiring layer electrically connected to the semiconductor chip, a thermal conductive layer disposed on an upper surface of the semiconductor chip, the thermal conductive layer having the same area as the semiconductor chip in a plan view, and a second redistribution portion disposed on the thermal conductive layer, the second redistribution portion including a first upper wiring layer connected to the thermal conductive layer and a second upper wiring layer electrically connected to the semiconductor chip through the first redistribution portion, wherein the first and second upper wiring layers are integrally formed, wherein the second redistribution portion further includes a first upper via and a second upper via, and wherein the first upper via is disposed between the first upper wiring layer and the thermal conductive layer, and the second upper via is disposed on a lower surface of the second upper wiring layer and has a height smaller than a height of the first upper via.

* * * * *